United States Patent
Lee et al.

(10) Patent No.: US 11,558,981 B2
(45) Date of Patent: Jan. 17, 2023

(54) THERMAL NANOPARTICLES ENCAPSULATION FOR HEAT TRANSFER

(71) Applicant: MERCURY MISSION SYSTEMS, LLC, Andover, MA (US)

(72) Inventors: Kang S. Lee, Tustin, CA (US); Tori Kennard, Torrance, CA (US); Christopher LaMontagna, Torrance, CA (US); Andrew Kostrzewski, Garden Grove, CA (US)

(73) Assignee: MERCURY MISSION SYSTEMS, LLC, Andover, MA (US)

( * ) Notice: Subject to any disclaimer, the term of this patent is extended or adjusted under 35 U.S.C. 154(b) by 0 days.

(21) Appl. No.: 16/832,955

(22) Filed: Mar. 27, 2020

(65) Prior Publication Data

US 2021/0307207 A1    Sep. 30, 2021

(51) Int. Cl.
*H05K 7/20* (2006.01)
*F28F 13/00* (2006.01)

(52) U.S. Cl.
CPC ........ *H05K 7/20481* (2013.01); *F28F 13/003* (2013.01); *F28F 2013/001* (2013.01)

(58) Field of Classification Search
CPC ...... H05K 7/20481; G06F 1/20; F28F 13/003; F28F 2013/001
See application file for complete search history.

(56) References Cited

U.S. PATENT DOCUMENTS

| | | | |
|---|---|---|---|
| 3,245,195 A * | 4/1966 | Shaw | C03B 19/08 53/433 |
| 8,587,945 B1 * | 11/2013 | Hartmann | G06F 1/203 361/708 |
| 2015/0049438 A1 * | 2/2015 | Derovanessian | H05K 7/20418 361/714 |
| 2017/0101571 A1 * | 4/2017 | Fukushima | A61B 3/112 |
| 2018/0199461 A1 * | 7/2018 | Huss | H01L 23/295 |
| 2018/0249593 A1 * | 8/2018 | Zhang | H01L 23/3737 |
| 2020/0098663 A1 * | 3/2020 | Sugiyama | H01L 23/295 |

* cited by examiner

*Primary Examiner* — Mukundbhai G Patel
(74) *Attorney, Agent, or Firm* — Sheppard, Mullin, Richter & Hampton LLP (57) ABSTRACT

Systems and methods described herein can provide a thermal interface for an electronic device including: obtaining an enclosure and a circuit within the enclosure, wherein the circuit is disposed within the enclosure such that there is space between the circuit and an internal surface of the enclosure; and positioning a thermally conductive material in the space between the circuit and an internal surface of the enclosure such that the thermally conductive material is in physical contact with an outer surface of the circuit and the internal surface of the enclosure to provide heat transfer from the circuit to the enclosure.

16 Claims, 12 Drawing Sheets

THERMAL NANOPARTICLES ENCAPSULATION FOR HEAT TRANSFER

TECHNICAL FIELD

The disclosed technology relates generally to techniques for electronic module cooling. More particularly, some embodiments relate to effective heat management for assembly of electronic modules.

BACKGROUND OF THE INVENTION

New logistics requirements from the U.S. military are to transition types of maintenance from depot and intermediate levels to an organizational level (0-level) of repairs. This change is driven by a demand for lower maintenance cost, lower life-cycle cost, and faster repair turnaround. One of the key elements assuring success of 0-level repairs is encapsulation of line-replaceable units (LRUs) into their own chassis. These modules are fully enclosed to minimize potential damage during the field replacement. Due to the volume of limitations in most military applications, these modules are tightly packaged into the existing external chassis, leaving less volume for convection-based cooling.

Packaging each LRU into its own chassis and placing them into an assembly with very limited spacing requires more efficient heat transfer from active LRU components to ambient environments. Heat generated by avionics electronic components builds up within the system's enclosures, leading to reduced MTBF, which might compromise system functionality and, in many cases, can lead to catastrophic failures. Military avionics systems are especially vulnerable due to the extreme operational temperature requirements, which can be as high as 80° C. ambient.

Standard thermal management systems relay on forced- or free-air convection and/or conduction, liquid cooling, state-changing materials, immersion cooling, and thermoelectric cooling. Due to the sensitive nature of the electronic components, free- or forced-air cooling is only available at the external enclosure walls or internal sealed tunnels, making it less effective. Moreover, the forced-air cooling relays on the air flow generators, using an undesirable mechanical motion of fans or blades that might have even lower MTBF than that of the cooled system.

Existing electronic systems offload the heat by three methods: radiation, convection, and conduction. The most effective method for heat transfer is conduction. The conductive cooling requires a direct heat path from the heat-generating component to the heatsink. Modern avionics systems with large numbers of electronic cards complicate the conductive heat transfer due to an intricate heat transfer geometry (only through connected metallic parts). This approach significantly increases the weight of the system, making it more vulnerable to vibration. Providing thermal pads between key heat-generating components and the chassis improves the heat transfer, but these are used on selected components and not the entire board, limiting their effectiveness. Thermal pads' thicknesses must be carefully selected to provide sufficient compressibility, requiring a multiple-pad thickness per single board.

BRIEF SUMMARY OF EMBODIMENTS

Embodiments of the systems and methods disclosed herein relate to the electronic system packaging aimed at improving thermal performance of electronic equipment, including tightly packaged modules like mission computers (MCs). In any commercial and military application, it is often desirable to provide efficient conductive cooling of electronic LRUs to assure long-term operations without failures. A large number of heat-generating electronic modules (~20) can be installed in a system like an MC. Efficient heat management is critical in maintaining high mean time between failures (MTBF), assuring high MC availability.

In various embodiments, efficient heat transfer can be accomplished by providing a low thermal resistivity path from the heat source to the heatsink. Conduction of heat within a module may be improved by packing low heat resistance and high electrical resistivity material, replacing convection with conduction. The internal heat-generating components may have direct contact with the module chassis providing the most efficient cooling for the volume. Thermal conductivity of greater than 10 W/m-K (watts per meter-Kelvin) provides for an efficient heat transfer. A loose material with high thermal conductivity can be poured into the chassis formed in place within the chassis about the components. The material can be cured to form a packed form-in-place thermal encapsulation material (FTEM) for thermal transfer. Preferably, the material has sufficient bonding strength to prevent moisture intrusion, has a high dielectric coefficient, cures at room temperature without solvents, has a fairly low viscosity to promote form-in-place molding, and is repairable and removable.

In various embodiments, thermal nanoparticles can be packed into the space within the module chassis. A magnetic field can be applied to align the particles in a desired orientation for higher heat transfer. One example of thermal nanoparticles can include hexagonal boron nitride, and the sealant can include an epoxy loaded with boron nitride. Boron nitride (or other like materials) can be selected because of its high thermal conductivity and high dielectric strength. Other materials with similar properties can be a composite of polypropylene blended with alumina and stellated carbon filler, which can have high direct current (DC) resistivity of ~$8\times10^{11}$ Ω and high thermal conductivity of 0.7 W/m-K.

According to various embodiments of the disclosed technology, an electronic device may include: an enclosure; a circuit within the enclosure, the circuit disposed within the enclosure such that there is space between the circuit and an internal surface of the enclosure; and a thermally conductive material disposed in the space between the circuit and an internal surface of the enclosure, and in physical contact with an outer surface of the circuit and the internal surface of the enclosure to provide heat transfer from the circuit to the enclosure.

The thermally conductive material may include a plurality of thermal nanoparticles positioned to fill the space between the circuit and the enclosure. The thermal nanoparticles may include hexagonal boron nitride. The electronic component may further include a sealant to seal the thermal nanoparticles within the chassis. The sealant may further include an epoxy that may further include boron nitride. The thermal nanoparticles may be aligned using a magnetic field to orient the thermal nanoparticles in a determined orientation. The thermally conductive material may further include a 3D form-in-place thermal encapsulated material.

The thermally conductive material may further include a material with a thermal conductivity of greater than 10 W/m-K. The thermally conductive material may further include a material with a thermal conductivity of greater than 15 W/m-K.

A method for providing a thermal interface for an electronic device may include: obtaining an enclosure and a circuit within the enclosure, wherein the circuit is disposed within the enclosure such that there is space between the circuit and an internal surface of the enclosure; and positioning a thermally conductive material in the space between the circuit and an internal surface of the enclosure such that the thermally conductive material is in physical contact with an outer surface of the circuit and the internal surface of the enclosure to provide heat transfer from the circuit to the enclosure.

The thermally conductive material may further include a plurality of thermal nanoparticles positioned to fill the space between the circuit and the enclosure.

The thermally conductive material may include a plurality of magnetically alignable thermal nanoparticles, with the method further including: depositing the magnetically alignable thermal nanoparticles into the space; using a vacuum pump to provide negative pressure within the space to draw the thermal nanoparticles into the space; and applying a magnetic field to the thermal nanoparticles in the space during the depositing operation to align the thermal nanoparticles to a desired orientation.

The vacuum pump may further include a nanoparticle filter to prevent the vacuum pump from removing some or all of the nanoparticles from the interior of the enclosure.

The thermal nanoparticles may include hexagonal boron nitride. The thermally conductive material may further include a three-dimensional form-in-place thermal encapsulation material.

The method may further include applying a sealant to seal the thermally conductive material within the chassis. The sealant may include an epoxy that may further include boron nitride.

Other features and aspects of the disclosed technology will become apparent from the following detailed description, taken in conjunction with the accompanying drawings that illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting in the breadth, scope, or applicability thereof. It should be noted that for clarity and ease of illustration, these drawings are not necessarily made to scale.

Some of the figures included herein illustrate various embodiments of the disclosed technology from different viewing angles. Although the accompanying descriptive text may refer to such views as "top," "bottom," or "side" views, such references are merely descriptive and do not imply or require that the disclosed technology be implemented or used in a particular spatial orientation unless explicitly stated otherwise.

The figures are not intended to be exhaustive or to limit the invention to the precise form disclosed. It should be understood that the invention can be practiced with modification and alteration, and that the disclosed technology can be limited only by the claims and the equivalents thereof.

DETAILED DESCRIPTION OF THE EMBODIMENTS

Electronic systems in general, and mission computer electronics in particular, are experiencing an increase in processing power and capability while being offered in smaller and smaller package sizes. Electronic systems are facing ever-increasing pressure to provide increased performance and integrated capabilities, while being further constrained by size, weight, power, and cost (SWaP-C) considerations. The increased performance is often due to factors such as consolidation of multiple legacy systems, increased processing requirements, increased throughput requirements, and increased data-storage requirements. These factors often conspire to drive up the amount of heat generated by the electronics in question, stressing the thermal management aspects of the design.

Ineffective thermal management can lead to premature failure of electronics components, limited performance or system functionality, or failure in extreme environments. It can also lead to dangers with respect to human factors considerations, such as where touch temperatures exceed acceptable values. As system performance requirements continue to increase while constrained by SWaP-C, effective thermal management becomes more critical to system functionality, longevity, and human factors.

Heat generated by avionics electronic components, for example, builds up within the system's enclosures, leading to reduced MTBF that might compromise system functionality and, in many cases, can lead to catastrophic failures. Military avionics systems are especially vulnerable due to the extreme operational temperature requirements that are as high as 80° C. in ambient temperature.

Standard thermal management systems relay on forced- or free-air convection and/or conduction, liquid cooling, state-changing materials, immersion cooling, and thermoelectric cooling. Due to the sensitive nature of the electronic components, the free- or forced-air cooling is only available at external enclosure walls or internal sealed tunnels, limiting its effectiveness. Moreover, the forced-air cooling relays on the air flow generators, using undesirable mechanical motion of fans or blades that might have an even lower MTBF than that of the cooled system.

Conductive cooling requires a direct heat path from the heat-generating component to the heatsink. Modern avionics systems with a large number of electronic cards complicate the conductive heat transfer due to an intricate heat transfer geometry (only through connected metallic parts). This approach significantly increases the weight of the system, making it more vulnerable to vibration. Providing thermal pads between key heat-generating components and the chassis improves the heat transfer, but these are used on selected components and not the entire board, limiting their effectiveness. Thermal pads' thicknesses must be carefully selected to provide sufficient compressibility, requiring a multiple-pad thickness per single board.

Figure 1:
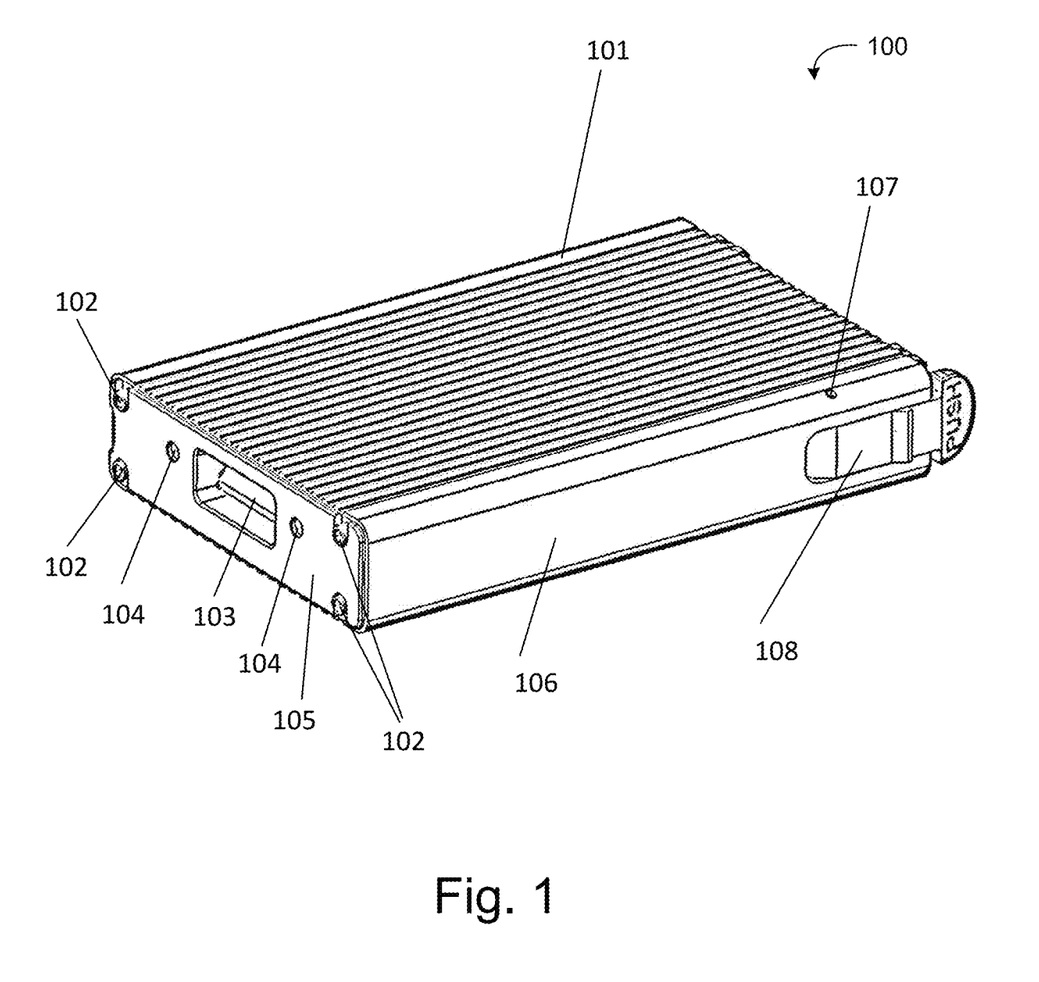
FIG. 1 is a first perspective view of such an example electronic system in accordance with embodiments of the systems and methods disclosed herein.
Figure 2:
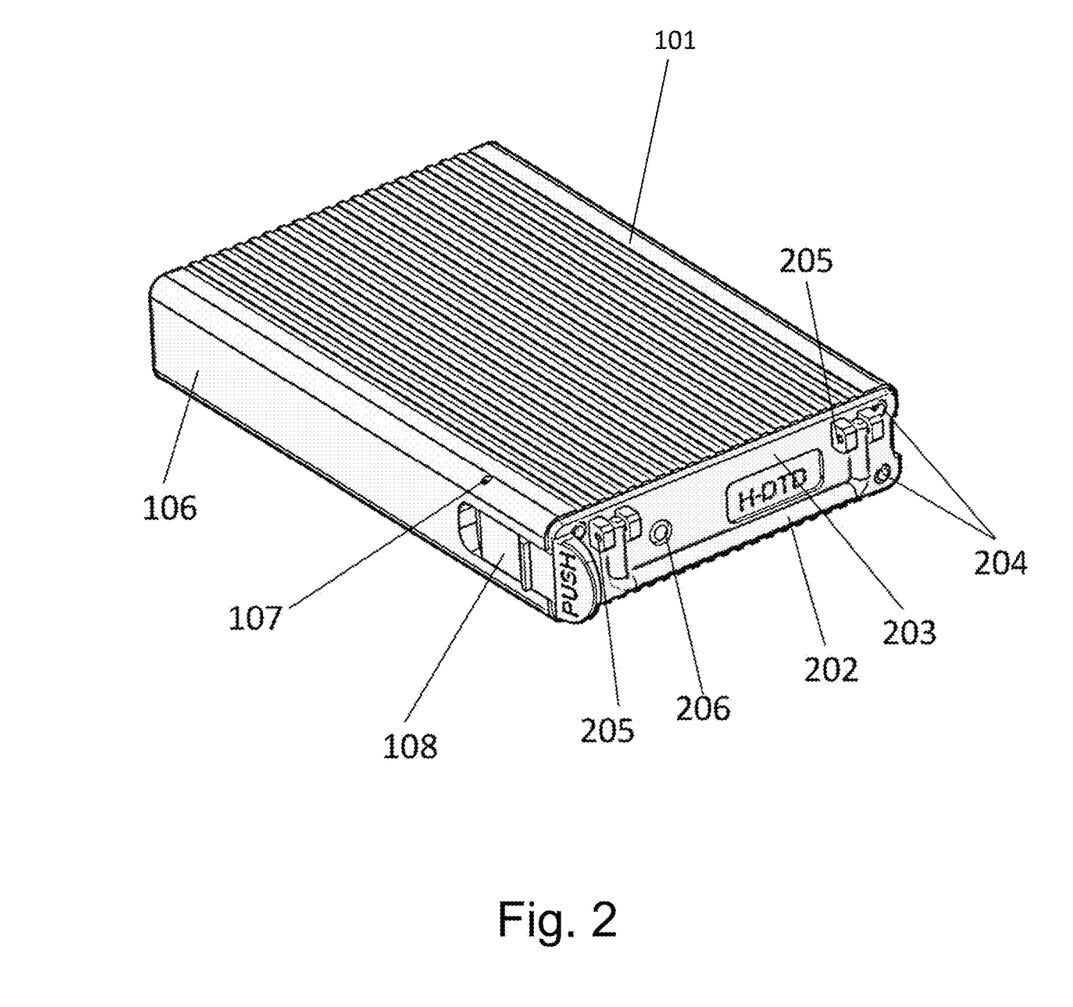
FIG. 2 is a second perspective view of the example electronic component depicted in FIG. 1 in accordance with embodiments of the systems and methods disclosed herein.

As would be apparent to one of ordinary skill in the art after reading this description, the technology disclosed herein can be used with any of a number of different electronic components and systems. For ease of discussion, some aspects of the technology are described in the context of an application to a circuit card housed in a mechanical housing or chassis. FIG. 1 is a first perspective view of such an example electronic system in accordance with one embodiment of the systems and methods disclosed herein. FIG. 2 is a second perspective view of the example electronic component depicted in FIG. 1. With reference now to FIGS. 1 and 2, the example electronic system 100 forms the context with which embodiments to maximize conductive heat transfer to a system chassis are described with reference to FIGS. 1-9. Example electronic system 100 includes a memory and a node circuit card housed in a node chassis 101. Chassis 101 in this example includes screw fasteners 102, spring and shutter 103, piston 104 (part of the cam shutter mechanism), base chassis 105, body chassis 106, pivot shaft 107, pushbutton 108, handle 202, screw fastener 204, pivot shaft 205 for handle 202, and a light pipe 206.

In this example, an electronic circuit card or cards may be housed in chassis 101 and the chassis may be assembled onto, for example, a backplane or other like structure. Although this example is described in terms of a memory node circuit card, a chassis such as this one may be used for a number of different applications including, for example, memory cards, processing circuits, communication circuits, and any of a number of different circuit cards. A connector on the backplane or like structure can be inserted through shutter 103 to provide electrical and mechanical connectivity to the unit and the card or cards contained therein. In this example, the chassis is fluted or grooved, which may provide additional surface area to improve cooling of the unit.

Figure 3:
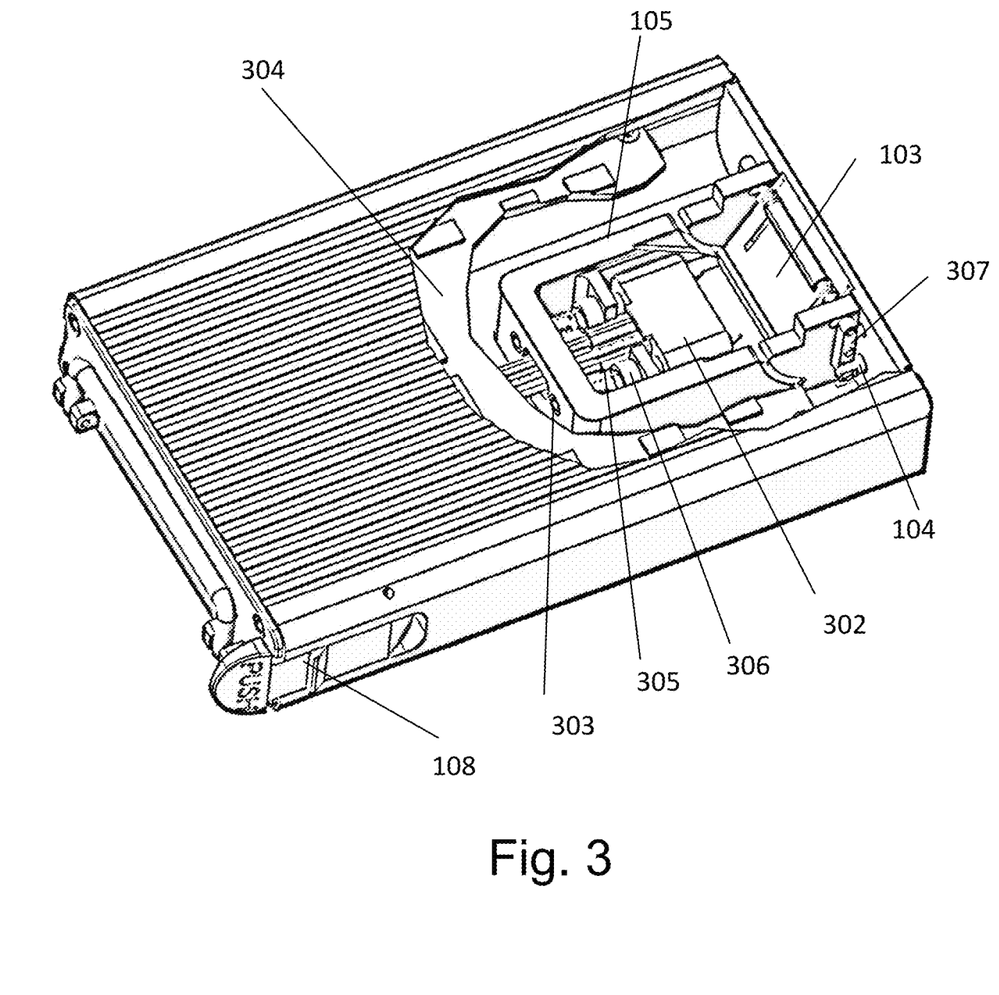
FIG. 3 illustrates a cutaway view of the example electronic system illustrated in FIGS. 1 and 2 in accordance with embodiments of the systems and methods disclosed herein.

FIG. 3 illustrates a cutaway view of the example electronic system illustrated in FIGS. 1 and 2. This example continues with the example of a memory circuit card and, thus, illustrates a high-capacity memory cartridge 301 cutaway to show the internal construction of the chassis and, in turn, a view of shutter mechanism 103. As this example illustrates, shutter mechanism 103 is mounted on a pivot arm and held in position by a torsion spring. This is described in further detail with reference to FIG. 4. Also illustrated in FIG. 3 are a male connector 302, a spring detent 303, a circuit card 304, a connector spring 305, a connector nut 306, and a shutter lever arm 307.

Figure 4:
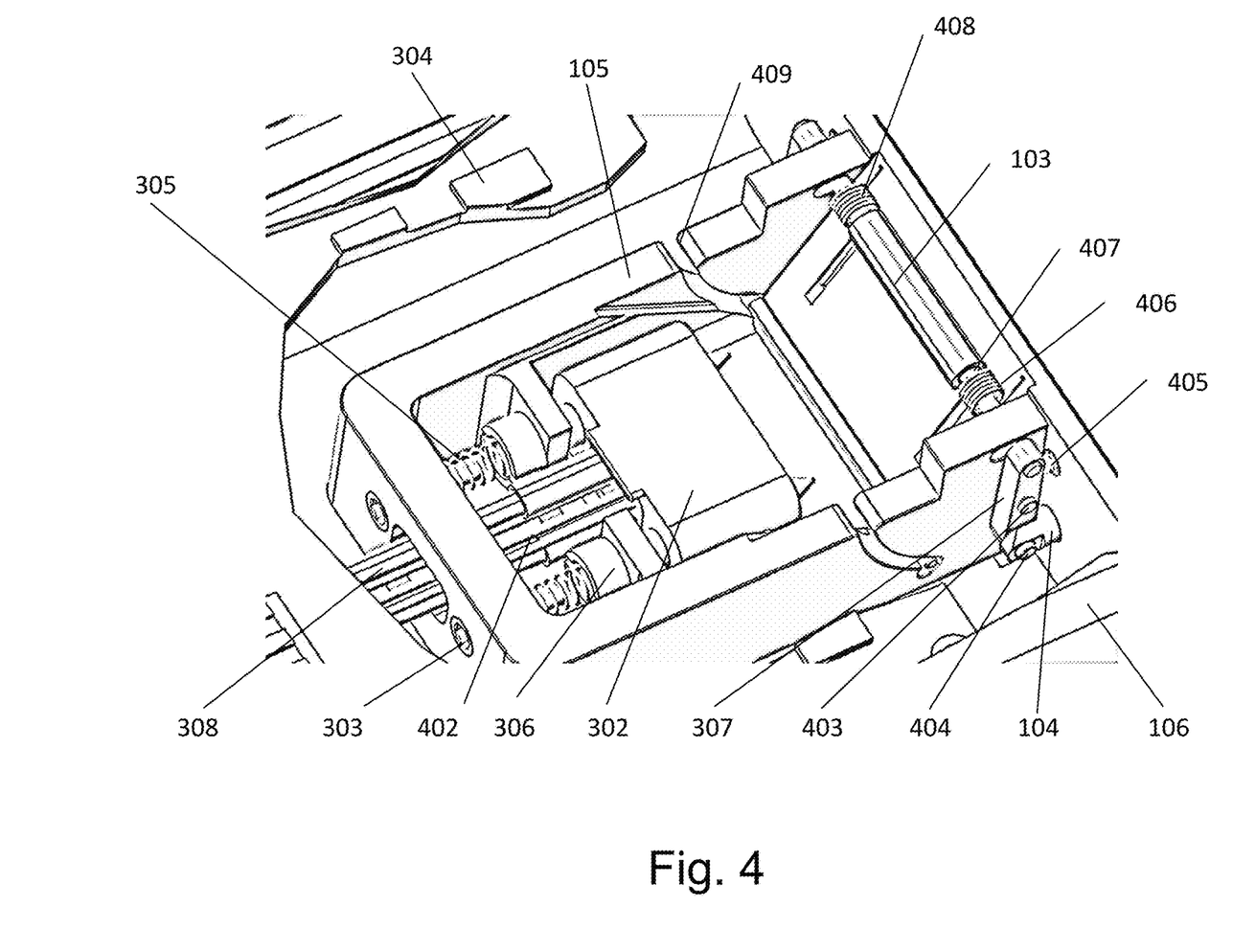
FIG. 4 illustrates a close-up view of the cutaway portion of the example in FIG. 3 in accordance with embodiments of the systems and methods disclosed herein.

FIG. 4 illustrates a close-up view of the cutaway portion of the example in FIG. 3. With reference now to FIG. 4, this example illustrates a cable harness 308, a connector harness 402, a lever arm pivot shaft 403, a piston pivot shaft 404, a piston spring 405, a shutter main pivot shaft 406, a left shutter torsion spring 407, and a right shutter torsion spring 408. As can be seen in FIG. 4, shutter 103 pivots about the axis of shutter main pivot shaft 406 so that shutter mechanism 103 may be opened and closed. Shutter mechanism 103 is opened to allow the female connector (not illustrated) to enter the body of the chassis and mate with male connector 302. Left and right shutter torsion springs 407, 408 apply pressure to shutter mechanism 103 to force shutter mechanism 103 into a closed position when the female connection is not present. During opening and closing operations, pins (not visible) of shutter mechanism 103 travel in arcuate slots 409 in the sides of the base chassis 105. By virtue of the left shutter torsion spring 407 and right shutter torsion spring 408, the chassis may remain closed when not in use to provide some protection from the environment.

Figure 5:
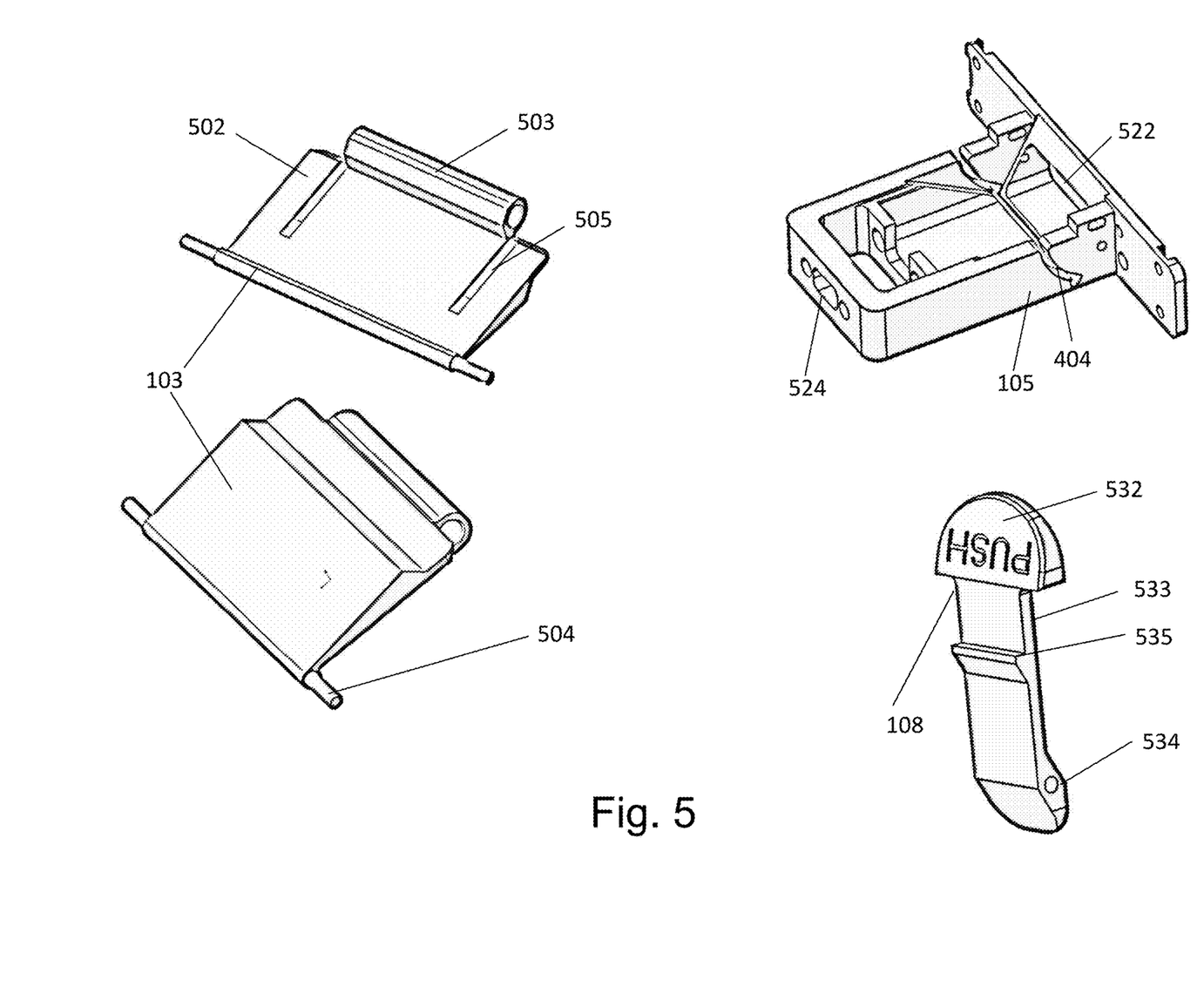
FIG. 5 illustrates components of the chassis in accordance with embodiments of the systems and methods disclosed herein.

FIG. 5 illustrates components of the chassis. Shutter mechanism 103 is illustrated as disassembled from the unit. This drawing illustrates shutter door 502, a sleeve 503 at the proximal end of the shutter body to accept shutter main pivot shaft 406, and pins 504 extending from either side of the distal end of shutter 103 and that travel in arcuate slots 409 of base chassis 105. This allows shutter 103 to move in a motion rotating about pivot shaft 406. Channels 505 may be provided to accept the ends of left and right shutter torsion springs 407, 408.

Also illustrated is a perspective view of base chassis 105. This view illustrates an aperture 522 to accept a connector, arcuate slots 409, and apertures 524 to provide access for a connector harness 402 to be attached to male connector 302. As this example also illustrates, base chassis 105 includes properly sized recesses to accommodate male connector 302. Although the examples in FIGS. 1-4 illustrate a male connector as being internal to the unit to interface with an externally supplied female connector, the roles of the male and female connectors may be reversed. The connectors may be single-pin or multipin connectors of various configurations. Likewise, the unit can be designed to accommodate multiple connectors.

Returning again to FIG. 5, pushbutton 108 is illustrated as including a tactile surface 532 to allow pressure to be placed on pushbutton 108, an elongated body 533, a pivot point 534 to accept a pin or shaft, and a locking tab 535. Pushbutton 108 may be used to secure the unit in place such as on a backplane or in a card cage, and it may be used to allow an operator to release tab 535 to allow removal of the unit.

Figure 6:
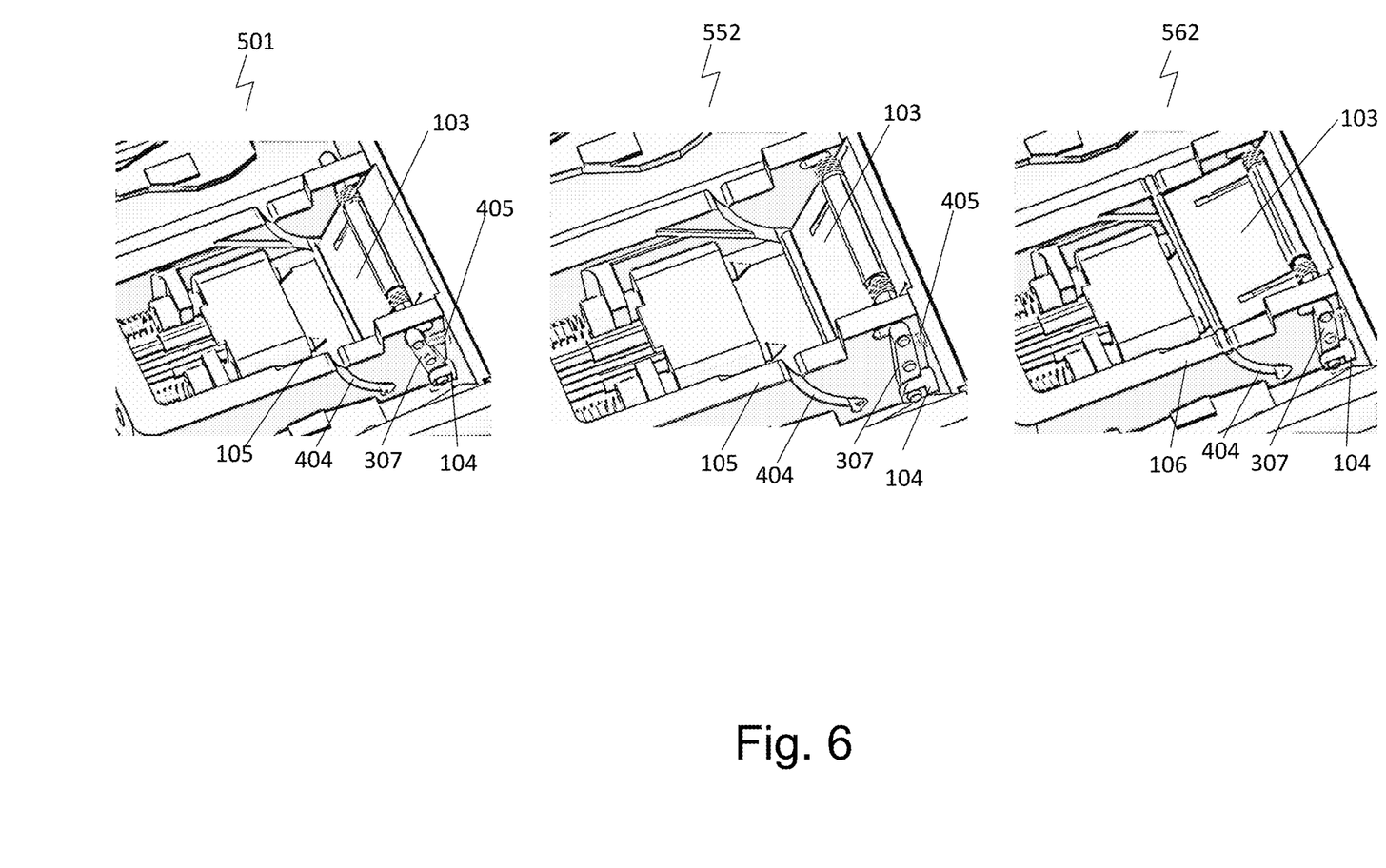
FIG. 6 illustrates a close-up cutaway view of the examples in FIGS. 1-5 in accordance with embodiments of the systems and methods disclosed herein with the shutter at a home position, an active position, and an open position.

FIG. 6 illustrates a close-up cutaway view of the examples in FIGS. 1-5 with the shutter 103 at a home position, an active position, and an open position. In this example, 501 illustrates the shutter 103 at the home position. In the home position 501, the piston spring 405 is fully extended and piston 104 is fully retracted. This forces the shutter cam mechanism lever arm 307 to push the spring and cam mechanism shutter 103 away from the base. The distal end of shutter 103 is thereby forced into a notched end of the arcuate slot 404 in the body of base chassis 105, which prevents the shutter from rotating. Accordingly, with such a mechanism, shutter 103 may effectively be locked in place, unable to be opened.

In the active position 552, the piston spring 405 is fully retracted and the piston 104 is fully extended. Piston 104 can be fully extended by the pair of pins in a host unit (e.g., pins 582 in FIG. 7). This forces shutter cam mechanism lever arm 307 to rotate and forces shutter 103 to move toward the base. The distal end of shutter 103 is forced away from the notched end of the arcuate slots 404, and shutter 103 is free to rotate about its pivot point. In the open position 562, piston spring 405 is fully retracted and piston 104 is fully extended. Shutter 103 is fully rotated to the open position by the host mating connector body (e.g., the body of mating connector 583 in FIG. 7). Upon removal of the host mating connector and trigger pins, shutter 103 is sprung shut by force applied by torsion springs 407, 408 and again locked into a closed position.

Figure 7:
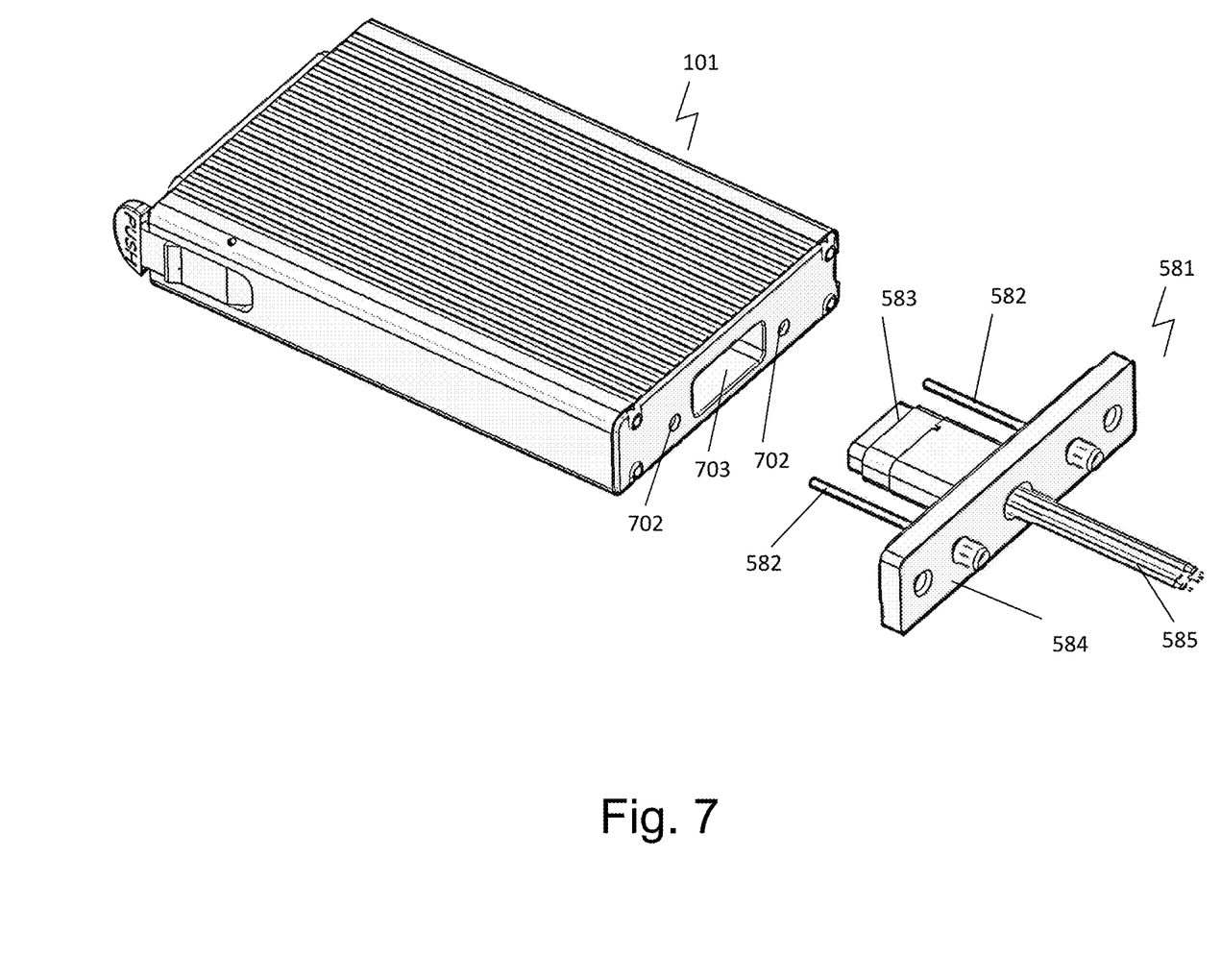
FIG. 7 illustrates a host unit that can include a connector to be made into a complementary connector within the chassis in accordance with embodiments of the systems and methods disclosed herein.

FIG. 7 illustrates a host unit 581 that can include a connector to be made into a complementary connector within the chassis. In this example, the host unit 581 includes a pair of piston trigger pins 582, a female mating connector 583, a host chassis 584, and female connector harness 585. Upon mating, piston trigger pins 582 enter chassis 101 through apertures 702 and contact pistons 104 (see, for example, FIG. 4). As described above with reference to FIG. 6, this allows shutter one to be pushed open by the body of female mating connector 583. Female mating connector 583 may then enter through aperture 703 and meet with male connector 302. Although host chassis 584 is illustrated as a stand-alone or single-connector unit, host chassis 584 may also comprise a backplane or other like member including multiple connectors with corresponding trigger pins.

Figure 8:
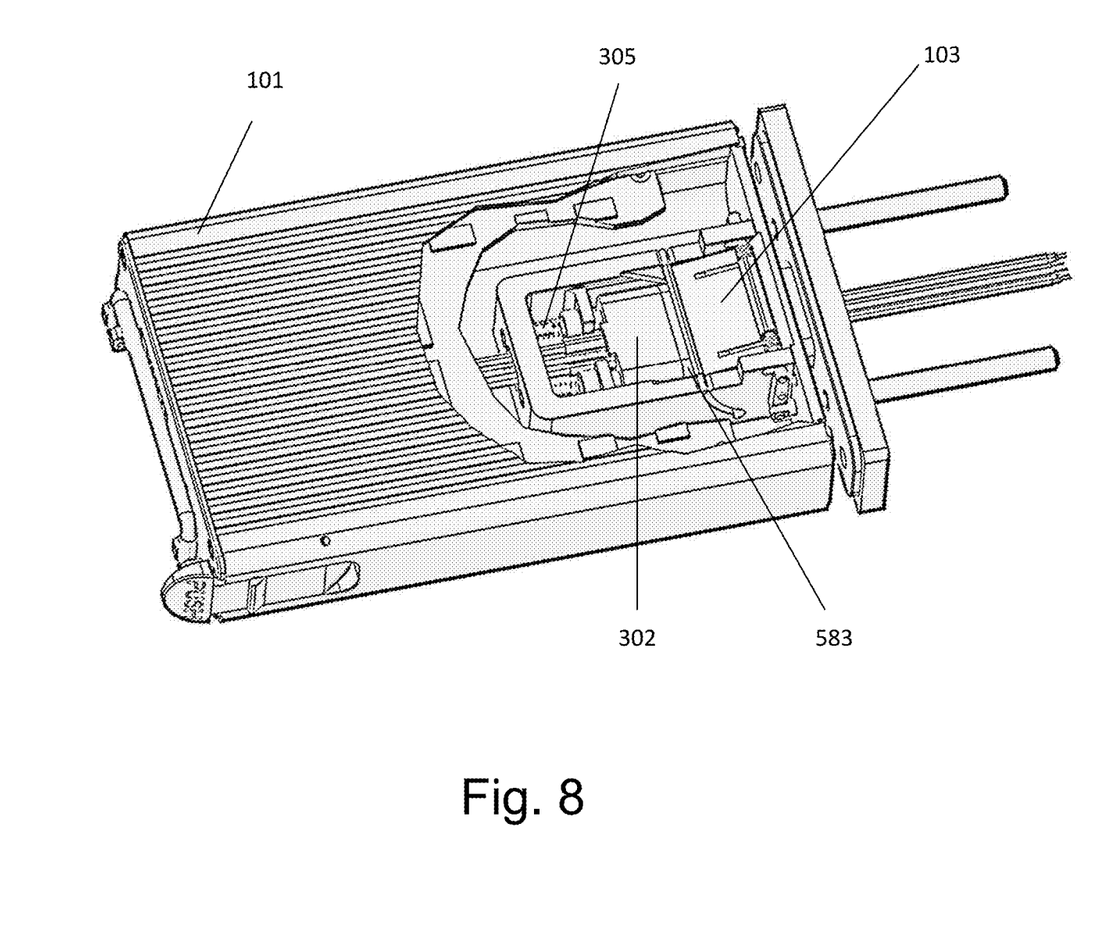
FIG. 8 illustrates the chassis docked with the host unit in accordance with embodiments of the systems and methods disclosed herein.

FIG. 8 illustrates chassis 101 docked with host unit 581. The cutaway portion of the figure illustrates shutter 103 and an open position with female connector 583 mated to male connector 302. In this example, full electrical and mechanical coupling has been achieved. Connector springs 305 may be used to provide adequate force for coupling operations.

Figure 9:
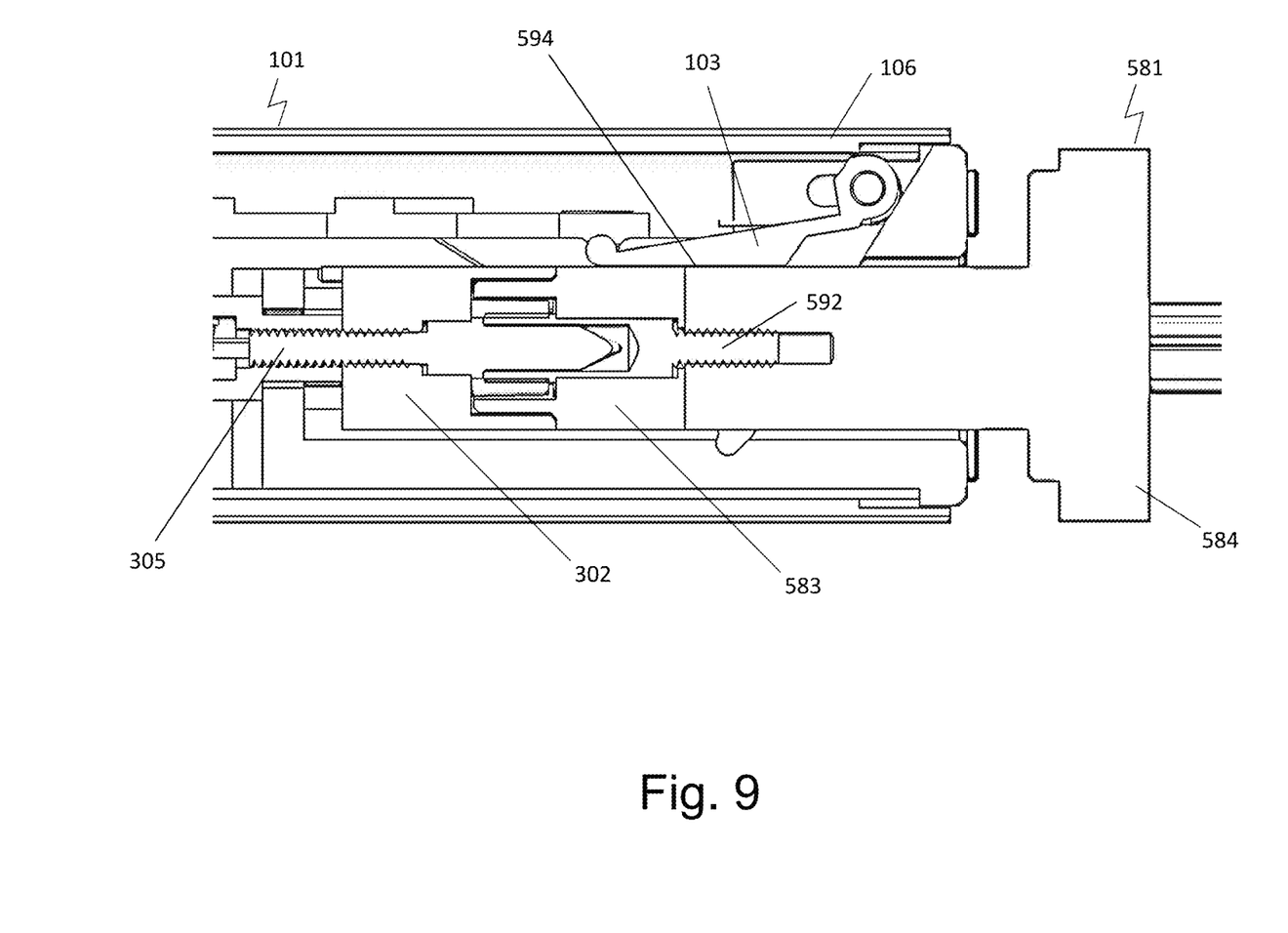
FIG. 9 illustrates a cross-sectional side view of the chassis docked with the host unit in accordance with embodiments of the systems and methods disclosed herein.

FIG. 9 illustrates a cross-sectional side view of the chassis docked with the host unit. In this example, shutter 103 is fully opened and female connector 583 is mated to male connector 302. As noted above, spring 305 provides a force to maintain male connector 302 in an engaged position. Likewise, spring 592 can be included to provide an opposing force to maintain female connector 583 in an engaged position with male connector 302. Maintaining a solid physical connection (in addition to the electrical connection) provides for improved heat transfer from the chassis to the host unit. Similarly, pressure provided by the torsion springs 407, 408 at shutter 103 provides solid physical contact between shutter 103 in the body of female connector 583. This also improves heat conduction from the chassis to the host unit. Because of this improved heat conduction, thermal management of heat generated by circuit card(s) 304 is improved. Likewise, shutter 103 can provide electrical grounding. As illustrated in the example in FIG. 9, shutter 103 includes a flat surface 594 that is at an angle relative to the shutter body such that it lies flat on female connector 583. This geometry increases the surface area that would otherwise be in contact with female connector 583 and thereby improves conduction of heat from chassis 101 to host unit 581.

Figure 10:
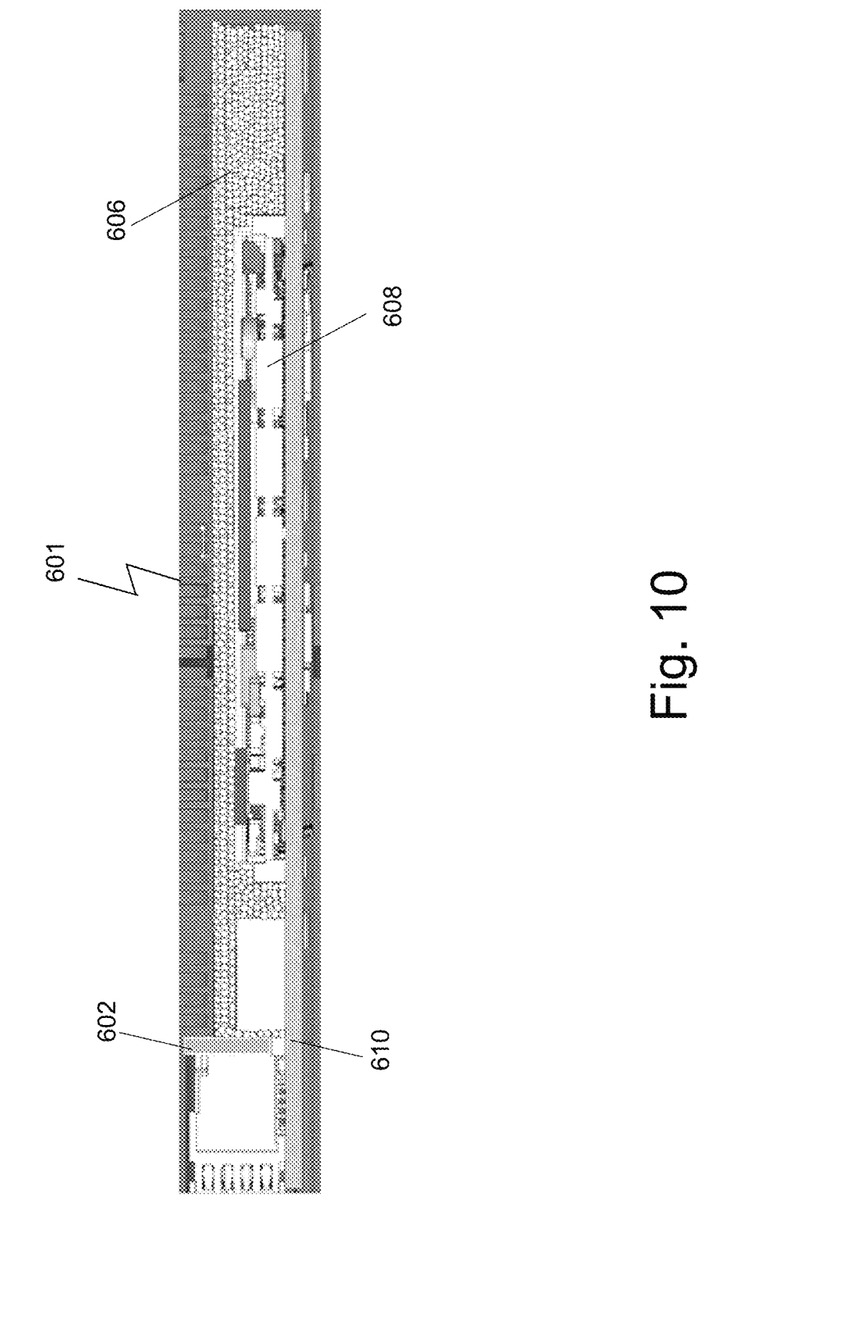
FIG. 10 illustrates an example electronic component with internal heat-generating components and thermally conductive materials in accordance with embodiments of the systems and methods disclosed herein.

In various applications, thermal materials may be provided inside of a chassis of an electronic device to improve thermal conduction. These materials can be used to improve the removal of heat from heat-generating components within the housing of the electronic device such as circuit boards and power supplies through the chassis. FIG. 10 illustrates an example electronic component with internal heat-generating components and thermally conductive materials in accordance with one embodiment. In this example, chassis 601 (e.g., chassis 101) is a chassis configured to contain internal circuitry. In this example, the internal circuitry includes a printed circuit board 610 with various chips, modules, or other components 608 mounted on there. There is space between the printed circuit board 610 and components 608 on the one hand and the interior surfaces of chassis 601 on the other hand. In this example, thermally conductive materials 606 are provided and disposed in this space to provide a more effective heat transfer between heat-generating components of components 608 and the body of chassis 601. The example in FIG. 10 also illustrates a top seal interface layer 602 to seal the thermally conductive material within the chassis.

In various applications, thermally conductive material 606 can include, for example, thermally encapsulated materials with high thermal conductivity. For example, thermal conductivity of greater than 10 W/m-K (watts per meter-Kelvin) are provided in some embodiments. In other embodiments, materials have thermal conductivity of greater than 15 W/m-K. In further embodiments, materials have thermal conductivity of greater than 17 W/m-K. In yet further embodiments, materials with other thermal conductivities can be provided in the selection of materials and may depend on the amount of heat transfer desired.

In one application, a 3D form-in-place thermal encapsulated material can be used to provide the thermally conductive material 606. A material with high thermal conductivity can be poured into the chassis informed in place within the chassis about the components. The material can be cured to form a packed FTEM for thermal transfer. Preferably, the material has sufficient bonding strength to prevent moisture intrusion, has a high dielectric coefficient, cures at room temperature without solvents, has a fairly low viscosity to promote formed-in-place molding, and is repairable and removable.

Figure 11:
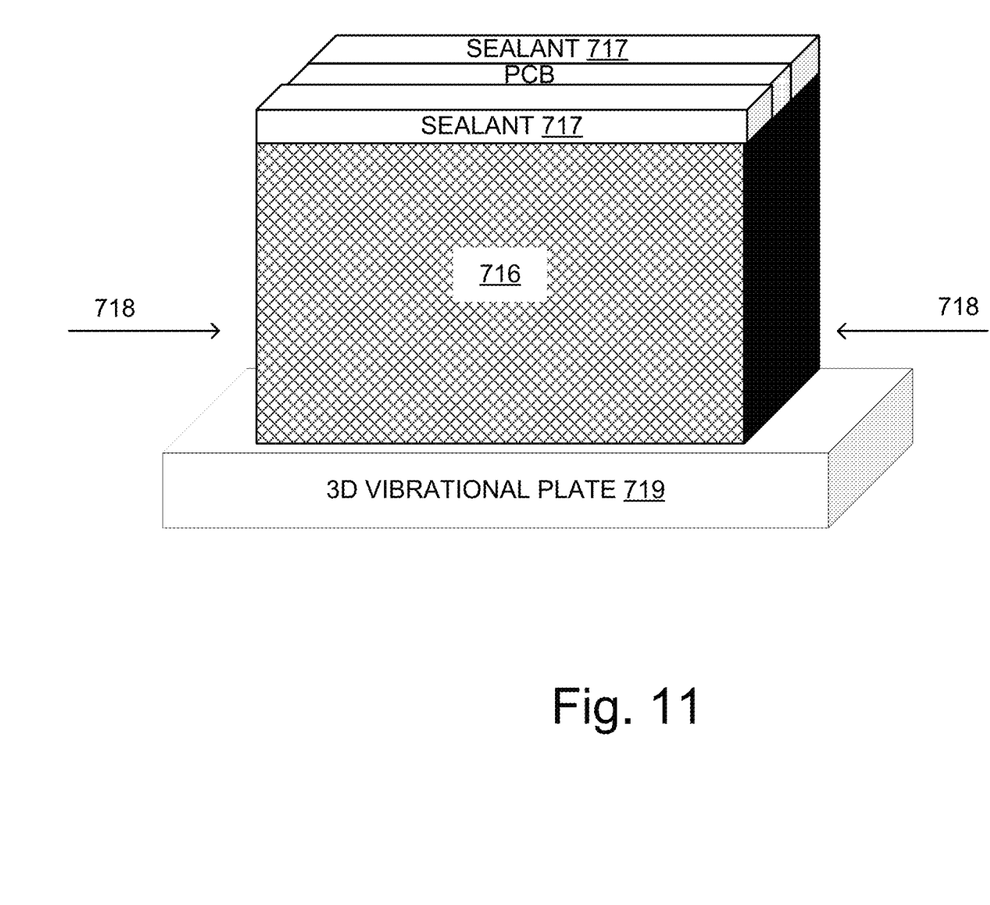
FIG. 11 illustrates one example of packed thermal nanoparticles in accordance with embodiments of the systems and methods disclosed herein.

In another application, thermal nanoparticles can be packed into the space within chassis 601. FIG. 11 illustrates one example of packed thermal nanoparticles in accordance with one embodiment. In this example, thermal nanoparticles 716 are packed in the chassis. A magnetic field 718 can be applied to align the particles in a desired orientation. A vibrational plate 719 can be used to facilitate alignment of the particles 716. A sealant 717 seals the aligned particles within the chassis. One example of thermal nanoparticles can include hexagonal boron nitride, and the sealant can include an epoxy loaded with boron nitride. Boron nitride or other like materials can be selected because of its high thermal conductivity and high dielectric strength. Other materials with similar properties can be a composite of polypropylene blended with alumina and stellated carbon filler, which can have high DC resistivity of $\sim 8 \times 10^{11} \Omega$ and high thermal conductivity of 0.7 W/m-K.

Figure 12:
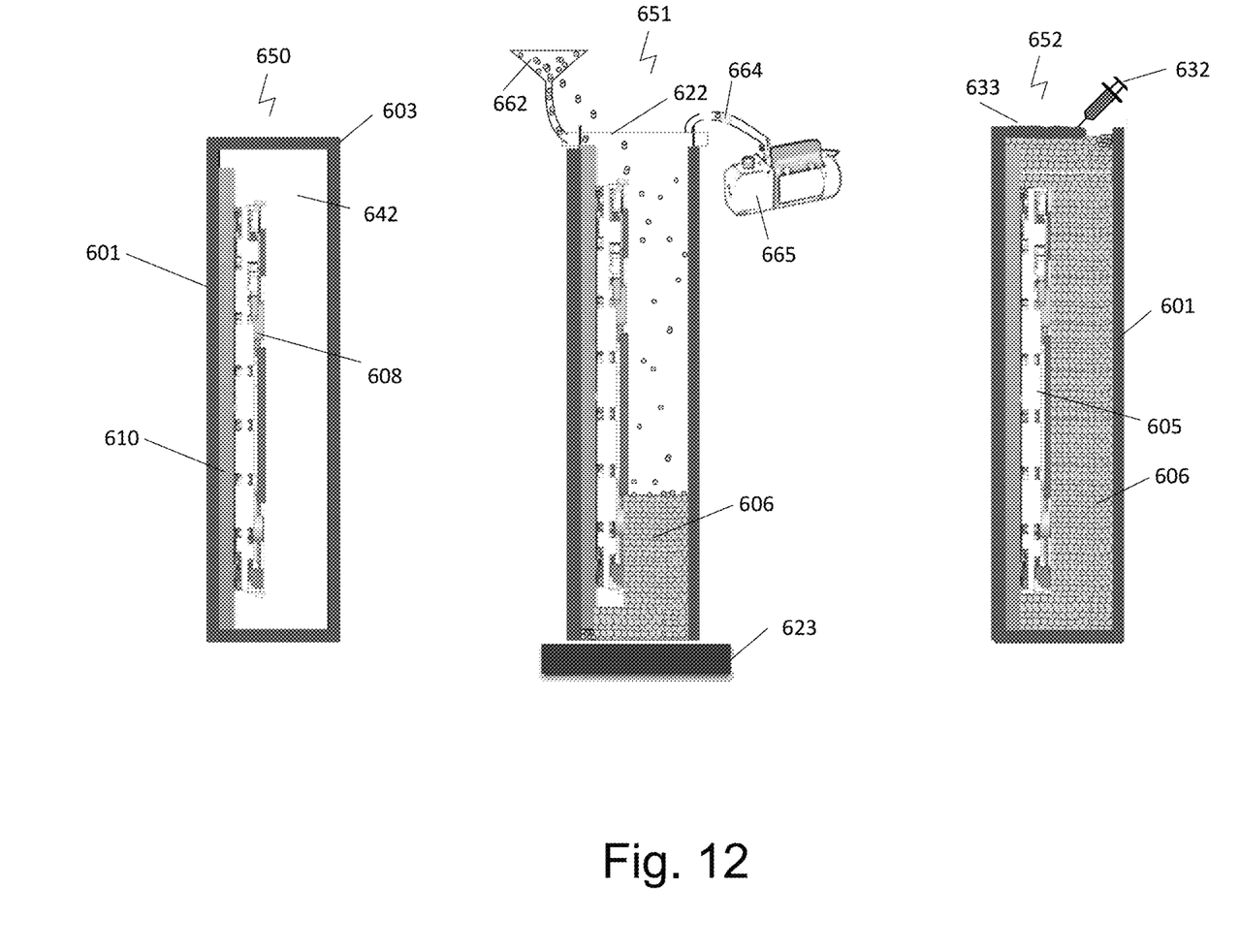
FIG. 12 illustrates an example process for packing a chassis of an electronic component with thermal nanoparticles in accordance with embodiments of the systems and methods disclosed herein.

FIG. 12 illustrates an example process for packing a chassis of an electronic component with thermal nanoparticles in accordance with one embodiment. In this example, vignette 650 illustrates an example of a chassis 601 with a printed circuit board 610 mounted within the chassis and components 608 mounted on the printed circuit board. There is a space or void between components 608 and printed circuit board 610 and the inner surfaces of chassis 601. This is denoted by reference 642. This void 642 can be filled with thermally conductive material such as thermally conductive nanoparticles.

Continuing with FIG. 12, vignette 651 illustrates an example of an operation to fill the void 642 with nanoparticles 606. In this example, nanoparticles 606 can be deposited (e.g., poured) into the void 642 using, for example, a funnel 662 or another mechanism to facilitate the operation. A vacuum pump 665 can be used to provide negative pressure within void 642 to facilitate the filling operation. The nanoparticles 606 can comprise magnetically alignable nanoparticles that can be aligned to a desired orientation during packing by application of a magnetic field. A magnet 623 can be included to provide this magnetic field, which aligns the particles. The particles can be aligned to take advantage of the directional properties that they may have for heat transfer. A nanoparticle filter 664 can be incorporated with the vacuum pump 665 to prevent the vacuum pump from removing nanoparticles from the interior of chassis 601.

With continued reference to FIG. 12, vignette 652 illustrates an example of packed magnetically aligned nanoparticles 606 to provide a thermal interface material within the interior of chassis 601. In this example the nanoparticles 606 have been packed and magnetically aligned into their highest thermal conductivity orientation. Use of the vacuum pump 665 and a vibrational plate can facilitate tighter packing of nanoparticles 606. This can yield a greater density and, hence, improve thermal conductivity. In the illustrated example, the nanoparticles 606 are sealed within chassis 601 using a sealant such as a conductive epoxy sealant 633, which may be applied by various means. The illustrated example applies sealant 633 using a syringe 632; however, other application methods can be used.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An electronic device, comprising:
an enclosure;
a circuit within the enclosure, the circuit disposed within the enclosure such that there is space between the circuit and an internal surface of the enclosure; and
a thermally conductive material disposed in the space between the circuit and an internal surface of the enclosure, and in physical contact with an outer surface of the circuit and the internal surface of the enclosure to provide heat transfer from the circuit to the enclosure, wherein the thermally conductive material comprises a three-dimensional form-in-place thermal encapsulation material and a plurality of thermal nanoparticles packed to fill the space between the circuit and the enclosure to yield a density for increased thermal conductivity and further wherein the plurality of nanoparticles are further packed facilitated by a vacuum pump and a vibrational plate and the plurality of nanoparticles are sealed within the enclosure.

2. The electronic device of claim 1, wherein the thermal nanoparticles comprise hexagonal boron nitride.

3. The electronic device of claim 2, further comprising a sealant to seal the thermal nanoparticles within a chassis.

4. The electronic device of claim 3, wherein the sealant comprises an epoxy that comprises boron nitride.

5. The electronic device of claim 1, wherein the thermal nanoparticles are aligned using a magnetic field to orient the thermal nanoparticles in a determined orientation.

6. The electronic device of claim 1, wherein the 3D form-in-place thermal encapsulated material has a bonding strength and provides formed-in-place molding.

7. The electronic device of claim 1, wherein the thermally conductive material comprises a material with a thermal conductivity of greater than 10 W/m-K.

8. The electronic device of claim 1, wherein the thermally conductive material comprises a material with a thermal conductivity of greater than 15 W/m-K.

9. The electronic device of claim 1, wherein the plurality of thermal nanoparticles are packed facilitated by a vacuum pump and a vibrational plate to yield a greater density for increased thermal conductivity.

10. A method for providing a thermal interface for an electronic device comprising:
   obtaining an enclosure and a circuit within the enclosure, wherein the circuit is disposed within the enclosure such that there is space between the circuit and an internal surface of the enclosure;
   positioning a thermally conductive material in the space between the circuit and an internal surface of the enclosure such that the thermally conductive material is in physical contact with an outer surface of the circuit and the internal surface of the enclosure to provide heat transfer from the circuit to the enclosure, wherein the thermally conductive material comprises a wherein the thermally conductive material comprises a three-dimensional form-in-place thermal encapsulation material and a plurality of thermal nanoparticles and positioning comprises packing the thermal nanoparticles to fill the space between the circuit and the enclosure to yield a density for increased thermal conductivity and further wherein packing the plurality of nanoparticles is facilitated by a vacuum pump and a vibrational plate; and
   sealing the plurality of nanoparticles within the enclosure.

11. The method of claim 10, wherein the plurality of thermal nanoparticles comprises a plurality of magnetically alignable thermal nanoparticles, with the method further comprising:
   depositing the magnetically alignable thermal nanoparticles into the space;
   using a vacuum pump to provide negative pressure within the space to draw the thermal nanoparticles into the space; and
   applying a magnetic field to the thermal nanoparticles in the space during the depositing operation to align the thermal nanoparticles to a desired orientation.

12. The method of claim 11, wherein the vacuum pump comprises a nanoparticle filter to prevent the vacuum pump from removing some or all of the nanoparticles from the interior of the enclosure.

13. The method of claim 10, wherein the thermal nanoparticles comprise hexagonal boron nitride.

14. The method of claim 10, wherein sealing the plurality of nanoparticles within the enclosure further comprises applying a sealant to seal the thermally conductive material within a chassis.

15. The method of claim 14, wherein the sealant comprises an epoxy that comprises boron nitride.

16. The method of claim 10, wherein the three-dimensional form-in-place thermal encapsulation material has a bonding strength and provides formed-in-place molding.

* * * * *